(12) United States Patent
Murata

(10) Patent No.: US 11,647,672 B2
(45) Date of Patent: May 9, 2023

(54) THERMOELECTRIC POWER GENERATION MODULE MOUNTING SUBSTRATE

(71) Applicant: KELK Ltd., Kanagawa (JP)

(72) Inventor: Tomonori Murata, Kanagawa (JP)

(73) Assignee: KELK Ltd., Kanagawa (JP)

( * ) Notice: Subject to any disclaimer, the term of this patent is extended or adjusted under 35 U.S.C. 154(b) by 0 days.

(21) Appl. No.: 17/643,637

(22) Filed: Dec. 10, 2021

(65) Prior Publication Data

US 2022/0209094 A1 Jun. 30, 2022

(30) Foreign Application Priority Data

Dec. 24, 2020 (JP) .............................. JP2020-215672

(51) Int. Cl.
*H01L 35/32* (2006.01)
*H01L 35/08* (2006.01)

(52) U.S. Cl.
CPC .............. *H01L 35/32* (2013.01); *H01L 35/08* (2013.01)

(58) Field of Classification Search
CPC .......... H01L 35/08; H01L 35/10; H01L 35/30; H01L 35/32
See application file for complete search history.

(56) References Cited

U.S. PATENT DOCUMENTS

| | | | |
|---|---|---|---|
| 5,522,225 A * | 6/1996 | Eskandari | H01L 35/30 62/3.7 |
| 2010/0163090 A1* | 7/2010 | Liu | H01L 35/32 136/224 |
| 2016/0276566 A1* | 9/2016 | Pirk | H05K 1/181 |

FOREIGN PATENT DOCUMENTS

| | | |
|---|---|---|
| JP | 2000091648 | 3/2000 |
| JP | 2001160632 | 6/2001 |

* cited by examiner

*Primary Examiner* — Tae-Sik Kang
(74) *Attorney, Agent, or Firm* — Fish & Richardson P.C.

(57) ABSTRACT

A thermoelectric power generation module mounting substrate includes: a printed substrate having a heat transfer through-hole penetrating a first surface and a second surface opposite to the first surface, and being in contact with a housing on the second surface; and a thermoelectric power generation module mounted on the printed substrate in contact with the first surface.

13 Claims, 2 Drawing Sheets

THERMOELECTRIC POWER GENERATION MODULE MOUNTING SUBSTRATE

CROSS-REFERENCE TO RELATED APPLICATION(S)

The present application claims priority to and incorporates by reference the entire contents of Japanese Patent Application No. 2020-215672, filed in Japan, on Dec. 24, 2020.

BACKGROUND OF THE INVENTION

1. Field of the Invention

The present disclosure relates to a thermoelectric power generation module mounting substrate.

2. Description of the Related Art

A thermoelectric power generation module using a thermoelectric conversion element is known. In the thermoelectric power generation module, a thermoelectric conversion element is disposed between a pair of substrates. The thermoelectric power generation module generates power by a Seebeck effect when a temperature difference is generated between the substrates.

For example, JP 2001-160632 A discloses a thermoelectric module that is connected to a conductive layer for power supply formed on an outer surface of an outer substrate via a through-hole formed in a ceramic substrate or the like, and can improve production efficiency in a step of mounting the thermoelectric module on a printed substrate or the like. In addition, JP 2000-091648 A discloses a Peltier module in which a thermoelectric conversion element is bonded to a wiring pattern of a printed substrate by solder, and a heat dissipation member housed in a through-hole of the printed substrate is bonded to the wiring pattern by solder, thereby significantly suppressing a decrease in heat dissipation capability.

By the way, in a case where a thermoelectric power generation module is mounted on a printed substrate, when the thermoelectric power generation module is disposed in a device or the like that generates heat, it is necessary to ensure heat transfer from a heat generator necessary for thermoelectric power generation. However, although the thermoelectric module of JP 2001-160632 A can be mounted on a surface of a printed substrate, heat dissipation efficiency may be suppressed by thermal resistance of the printed substrate. In addition, in the Peltier module of JP 2000-091648 A, since a thermoelectric conversion element is directly bonded onto a printed substrate by solder, the thermoelectric module itself cannot be handled as a surface mounting component, and assembly is difficult disadvantageously.

An object of the present disclosure is to promote heat transfer.

SUMMARY OF THE INVENTION

It is an object of the present invention to at least partially solve the problems in the conventional technology.

According to an aspect of the present invention, a thermoelectric power generation module mounting substrate comprises: a printed substrate having a heat transfer through-hole penetrating a first surface and a second surface opposite to the first surface, and being in contact with a housing on the second surface; and a thermoelectric power generation module mounted on the printed substrate in contact with the first surface.

The above and other objects, features, advantages and technical and industrial significance of this invention will be better understood by reading the following detailed description of presently preferred embodiments of the invention, when considered in connection with the accompanying drawings.

DETAILED DESCRIPTION

Hereinafter, an embodiment of the present disclosure will be described with reference to the drawings, but the present disclosure is not limited thereto. Components of the embodiment described below can be appropriately combined with each other. In addition, some components are not used in some cases.

In the embodiment, an XYZ orthogonal coordinate system is set, and a positional relationship among units will be described with reference to the XYZ orthogonal coordinate system. A direction parallel to an X axis in a predetermined plane is defined as an X axis direction, a direction parallel to a Y axis orthogonal to the X axis in the predetermined plane is defined as a Y axis direction, and a direction parallel to a Z axis orthogonal to the predetermined plane is defined as a Z axis direction. An XY plane including the X axis and the Y axis is parallel to the predetermined plane.

Embodiment

Figure 1:
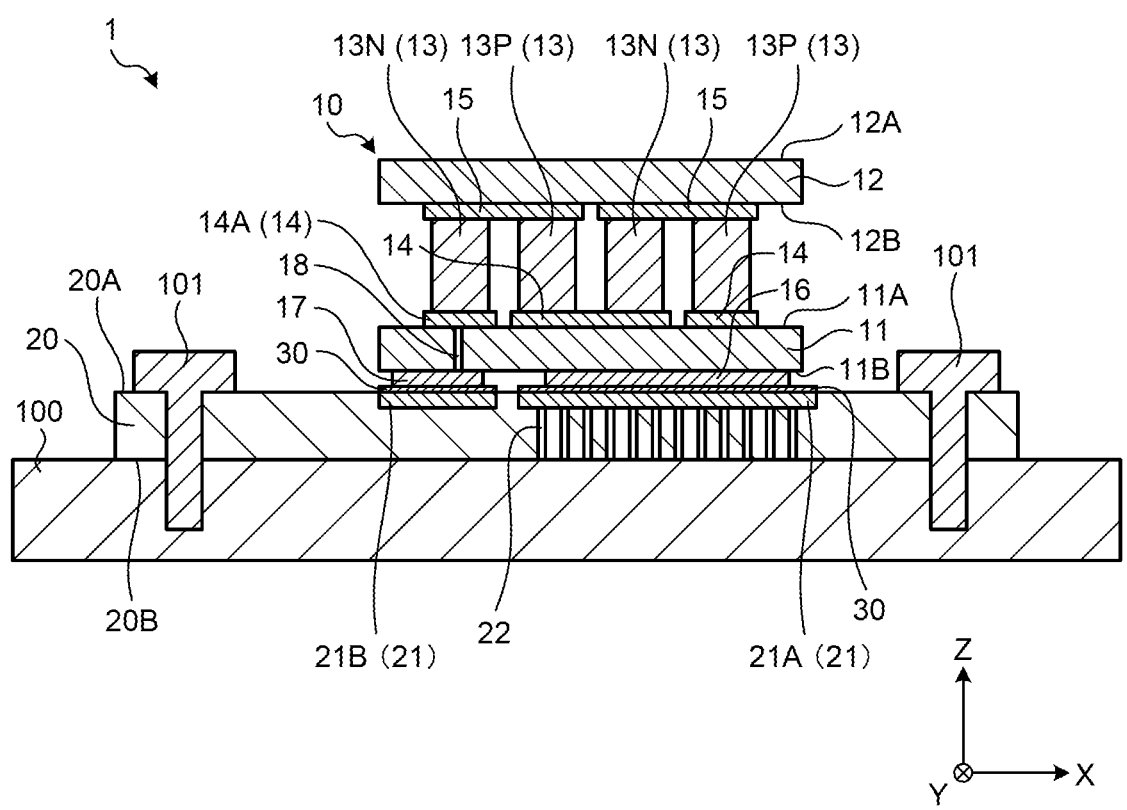
FIG. 1 is a cross-sectional view schematically illustrating a thermoelectric power generation module mounting substrate according to an embodiment.
Figure 2:
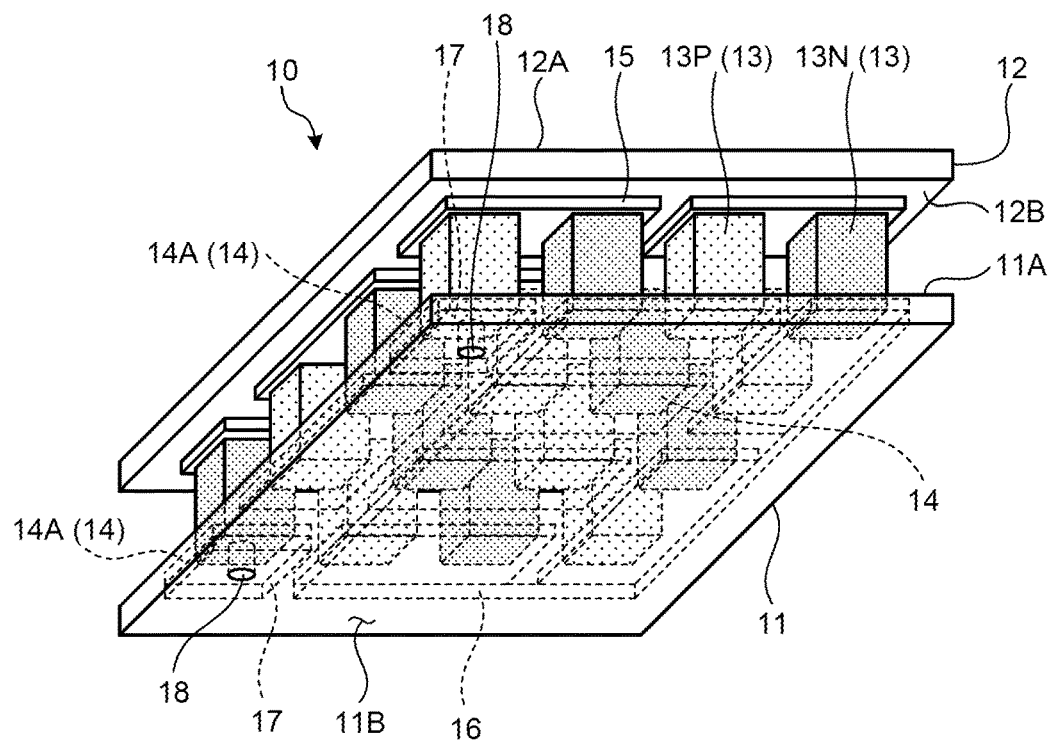
FIG. 2 is a perspective view schematically illustrating a thermoelectric power generation module according to the embodiment.
Figure 3:
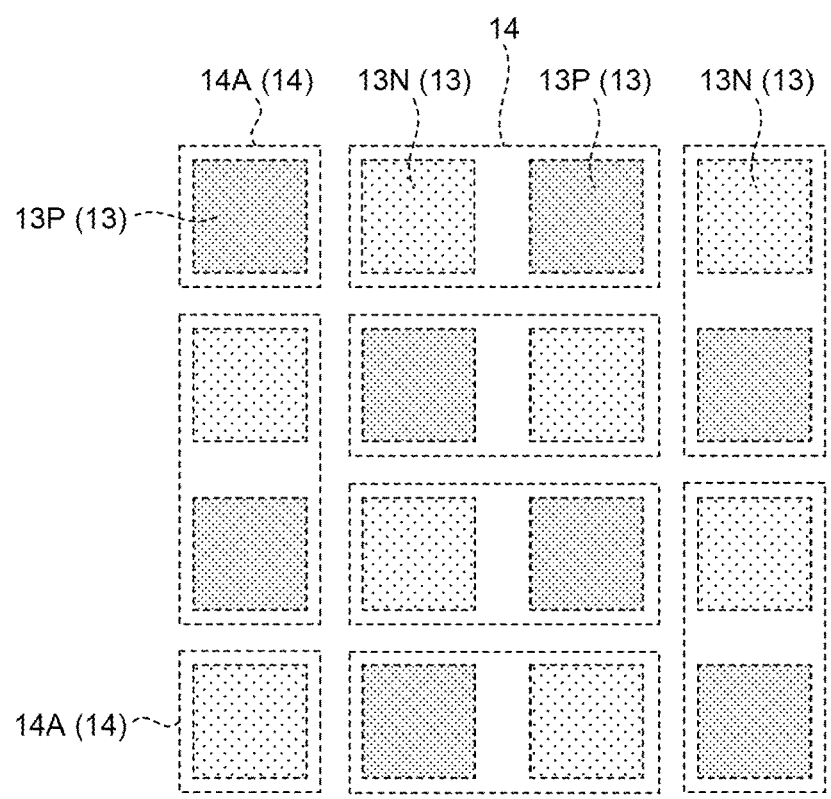
FIG. 3 is an explanatory diagram for explaining an arrangement of a thermoelectric conversion element and a first electrode according to the embodiment.

FIG. 1 is a cross-sectional view schematically illustrating a thermoelectric power generation module mounting substrate 1 according to an embodiment. FIG. 2 is a perspective view schematically illustrating a thermoelectric power generation module 10 according to the embodiment. FIG. 3 is an explanatory diagram for explaining an arrangement of a thermoelectric conversion element 13 and a first electrode 14 according to the embodiment. The thermoelectric power generation module mounting substrate 1 is disposed on a housing 100. The housing 100 is, for example, a housing 100 of a device disposed in an industrial facility such as a factory. The housing 100 is made of a metal material having thermal conductivity. The thermoelectric power generation module mounting substrate 1 is fixed to the housing 100 by a screw 101.

As illustrated in FIG. 1, the thermoelectric power generation module mounting substrate 1 includes the thermoelectric power generation module 10 and a printed substrate 20 on which the thermoelectric power generation module 10 is mounted.

The thermoelectric power generation module 10 generates power using a Seebeck effect. The housing 100 functions as a heat source of the thermoelectric power generation module 10. When a −Z-side end face of the thermoelectric power generation module 10 is heated and a temperature difference is generated between the −Z-side end face and a +Z-side end face of the thermoelectric power generation module 10, the thermoelectric power generation module 10 generates power. As illustrated in FIGS. 1 and 2, the thermoelectric power generation module 10 includes a first substrate 11, a second substrate 12, the thermoelectric conversion element 13, the first electrode 14, a second electrode 15, a first conductive layer 16, a second conductive layer 17, and an electrode through-hole 18.

The first substrate 11 and the second substrate 12 are made of an electrically insulating material. In the embodiment, the first substrate 11 and the second substrate 12 are ceramic substrates. The first substrate 11 and the second substrate 12 are made of oxide ceramic or nitride ceramic. Examples of the oxide ceramic include aluminum oxide ($Al_2O_3$) and zirconium oxide ($ZrO_2$). Examples of the nitride ceramic include silicon nitride ($Si_3N_4$) and aluminum nitride (AlN).

The first substrate 11 faces the printed substrate 20 with a gap interposed therebetween. The first substrate 11 has a first surface 11A facing the +Z direction and a second surface 11B facing the −Z direction. The first surface 11A faces a space between the first substrate 11 and the second substrate 12. That is, the first surface 11A faces a space where the thermoelectric conversion element 13 is present. The second surface 11B faces a space where the printed substrate 20 is present. Each of the first surface 11A and the second surface 11B is substantially parallel to the XY plane.

The second substrate 12 faces the first substrate 11 with a gap interposed therebetween. The second substrate 12 has a first surface 12A facing the +Z direction and a second surface 12B facing the −Z direction. The first surface 12A faces the atmospheric space. The second surface 11B faces a space between the first substrate 11 and the second substrate 12. That is, the second surface 11B faces a space where the thermoelectric conversion element 13 is present. Each of the first surface 12A and the second surface 12B is substantially parallel to the XY plane.

The thermoelectric conversion element 13 is disposed in a space between the first substrate 11 and the second substrate 12. The thermoelectric conversion element 13 includes a first thermoelectric conversion element 13N that is an n-type thermoelectric semiconductor element and a second thermoelectric conversion element 13P that is a p-type thermoelectric semiconductor element. A plurality of the first thermoelectric conversion elements 13N and a plurality of the second thermoelectric conversion elements 13P are disposed in the XY plane. The first thermoelectric conversion elements 13N and the second thermoelectric conversion elements 13P are alternately disposed in the X axis direction. The first thermoelectric conversion elements 13N and the second thermoelectric conversion elements 13P are alternately disposed in the Y axis direction. Lower surfaces of the first thermoelectric conversion elements 13N and the second thermoelectric conversion elements 13P are connected to the first electrode 14. Upper surfaces of the first thermoelectric conversion elements 13N and the second thermoelectric conversion elements 13P are connected to the second electrode 15.

The thermoelectric conversion element 13 is made of, for example, a thermoelectric material such as a bismuth tellurium-based compound (Bi—Te). Examples of the thermoelectric material forming the thermoelectric conversion element 13 include bismuth (Bi), a bismuth tellurium-based compound (Bi—Te), a bismuth antimony-based compound (Bi—Sb), a lead tellurium-based compound (Pb—Te), a cobalt antimony-based compound (Co—Sb), an iridium antimony-based compound (Ir—Sb), a cobalt arsenic-based compound (Co—As), a silicon germanium-based compound (Si—Ge), a copper selenium-based compound (Cu—Se), a gadolium selenium-based compound (Gd—Se), a boron carbide-based compound, a tellurium-based perovskite oxide, a rare earth sulfide, a TAGS-based compound (GeTe—$AgSbTe_2$), a Heusler type TiNiSn, FeNbSb, and a TiCoSb-based substance.

The first electrode 14 and the second electrode 15 supply power to the thermoelectric conversion element 13. The first electrode 14 is connected to the first surface 11A of the first substrate 11. A plurality of the first electrodes 14 is disposed on the first surface 11A of the first substrate 11. The first electrode 14 is connected to each of the first thermoelectric conversion element 13N and the second thermoelectric conversion element 13P adjacent to the first electrode 14. The second electrode 15 is connected to the second surface 12B of the second substrate 12. The second electrode 15 is connected to each of the first thermoelectric conversion element 13N and the second thermoelectric conversion element 13P. The second electrode 15 is connected to each of the first thermoelectric conversion element 13N and the second thermoelectric conversion element 13P adjacent to the second electrode 15.

As illustrated in FIG. 2, the first thermoelectric conversion element 13N and the second thermoelectric conversion element 13P are connected to each other in series via the first electrode 14 and the second electrode 15. As illustrated in FIGS. 2 and 3, in the embodiment, a first electrode 14 connected to a thermoelectric conversion element 13 disposed at an end of the thermoelectric conversion elements 13 connected to each other directly is referred to as a first electrode 14A.

As illustrated in FIGS. 1 and 2, the first conductive layer 16 is disposed on the second surface 11B side of the first substrate 11. The first conductive layer 16 is disposed on a part of the second surface 11B of the first substrate 11. An upper surface of the first conductive layer 16 is connected to the second surface 11B side of the first substrate 11. The first conductive layer 16 is made of a conductive material such as metal. The first conductive layer 16 is disposed at a position where the electrode through-hole 18 described later is not formed. That is, the first conductive layer 16 is electrically insulated from the thermoelectric conversion element 13, the first electrode 14, the second electrode 15, the second conductive layer 17, and the electrode through-hole 18.

The second conductive layer 17 is disposed on the second surface 11B side of the first substrate 11. The second conductive layer 17 is disposed on a part of the second surface 11B of the first substrate 11. An upper surface of the second conductive layer 17 is connected to the second surface 11B side of the first substrate 11. The second conductive layer 17 is made of a conductive material such as metal. The second conductive layer 17 is connected to the first electrode 14A connected to the thermoelectric conversion element 13 located at an end via the electrode through-hole 18. The second conductive layer 17 is electrically insulated from the first conductive layer 16.

The electrode through-hole 18 is a through-hole penetrating the first surface 11A and the second surface 11B of the first substrate 11. Copper plating is applied to an inner peripheral surface of the electrode through-hole 18. The electrode through-hole 18 is in contact with the first electrode 14A on the first surface 11A side of the first substrate 11. The electrode through-hole 18 is in contact with the second conductive layer 17 on the second surface 11B side of the first substrate 11. As a result, the electrode through-hole 18 makes the first electrode 14A disposed on the first surface 11A of the first substrate 11 and the second conductive layer 17 disposed on the second surface 11B electrically conductive with each other. The inside of the electrode through-hole 18 may be filled with a conductive material.

The printed substrate 20 is made of an electrically insulating material. In the embodiment, the printed substrate 20 is a glass epoxy substrate. The printed substrate 20 has a pad 21 and heat transfer through-holes 22.

The printed substrate 20 faces the thermoelectric power generation module 10. The printed substrate 20 is fixed to the housing 100 by the screw 101. The printed substrate 20 has a first surface 20A facing the +Z direction and a second surface 20B facing the −Z direction. The first surface 20A faces a space on a side where the thermoelectric power generation module 10 is disposed. The second surface 20B faces an upper surface of the housing 100. Each of the first surface 20A and the second surface 20B is substantially parallel to the XY plane.

The pad 21 is a copper foil for soldering for mounting a surface mounting component such as the thermoelectric power generation module 10 on the printed substrate 20. A plurality of the pads 21 is disposed on the first surface 20A side of the printed substrate 20. The thermoelectric power generation module 10 is mounted on the printed substrate 20 by being fixed by solder 30. In the embodiment, the pad 21 includes a heat transfer pad 21A and an electrode pad 21B. In the thermoelectric power generation module 10, the first conductive layer 16 is fixed to the heat transfer pad 21A by the solder 30. In the thermoelectric power generation module 10, the second conductive layer 17 is fixed to the electrode pad 21B by the solder 30.

The heat transfer through-holes 22 are a plurality of through-holes penetrating the first surface 20A and the second surface 20B of the printed substrate 20. Copper plating is applied to an inner peripheral surface of each of the heat transfer through-holes 22. The heat transfer through-holes 22 are connected to the pad 21 connected to the first conductive layer 16 via the solder 30 on the first surface 20A side of the printed substrate 20. The heat transfer through-holes 22 are in contact with an upper surface of the housing 100 on the second surface 20B side of the printed substrate 20.

As a result, in the heat transfer through-holes 22, heat can be transferred between the first conductive layer 16 disposed on the second surface 11B of the first substrate 11 of the thermoelectric power generation module 10 and the housing 100. In the heat transfer through-holes 22, in order to improve heat conductivity, preferably, the diameter of each of the heat transfer through-holes 22 is reduced and the number of the heat transfer through-holes 22 is increased to increase the density of the through-holes per area.

In the thermoelectric power generation module mounting substrate 1 configured as described above, when the housing 100 generates heat, heat is transferred from an upper surface of the housing 100 to the first substrate 11 via the heat transfer through-holes 22, the pad 21, the solder 30, and the first conductive layer 16, and the first substrate 11 of the thermoelectric power generation module 10 is heated.

In the thermoelectric power generation module 10, when the first substrate 11 is heated, a temperature difference is generated between a +Z-side end and a −Z-side end of each of the first thermoelectric conversion element 13N and the second thermoelectric conversion element 13P. When a temperature difference is generated between the +Z-side end and the −Z-side end of the first thermoelectric conversion element 13N, electrons move in the first thermoelectric conversion element 13N. When a temperature difference is generated between the +Z-side end and the −Z-side end of the second thermoelectric conversion element 13P, holes move in the second thermoelectric conversion element 13P. The electrons and the holes generate a potential difference between the first electrode 14 and the second electrode 15. When a potential difference is generated between the first electrode 14 and the second electrode 15, the thermoelectric power generation module 10 generates power.

The thermoelectric power generation module 10 outputs power from the first electrode 14A connected to a thermoelectric conversion element 13 disposed at an end of the thermoelectric conversion elements 13 connected to each other directly via the electrode through-hole 18 and the second conductive layer 17. As a result, the power output from the thermoelectric power generation module 10 is supplied to an electronic circuit of the printed substrate 20 via the solder 30 and the pad 21.

Effect

As described above, according to the embodiment, the printed substrate 20 has the heat transfer through-holes 22 penetrating the first surface 20A and the second surface 20B. The second surface 20B of the printed substrate 20 is in contact with the housing 100. The thermoelectric power generation module 10 is mounted on the first surface 20A side of the printed substrate 20. When the housing 100 generates heat, the printed substrate 20 receives heat of the housing 100 from the second surface 20B, and transfers the heat to the thermoelectric power generation module 10 via the heat transfer through-holes 22. As a result, the thermoelectric power generation module 10 generates power by heat of the housing 100.

By mounting the thermoelectric power generation module 10 on the printed substrate 20 to integrate the thermoelectric power generation module 10 with the printed substrate 20, it is unnecessary to fix the thermoelectric power generation module 10 to a heat generating member (housing 100) with grease. In addition, by fixing printed substrate 20 to the housing 100 with a screw or the like, the thermoelectric power generation module 10 can be fixed to the housing 100. Therefore, positioning is facilitated.

When the thermoelectric power generation module 10 is disposed, it is necessary to improve heat conductivity from the housing 100. According to the embodiment, heat is transferred between the second surface 20B in contact with the housing 100 and the first surface 20A connected to the thermoelectric power generation module 10 by the heat transfer through-holes 22. Therefore, a decrease in heat transfer efficiency due to thermal resistance of a base material of the printed substrate 20 can be suppressed.

In the embodiment, the thermoelectric power generation module 10 includes the first conductive layer 16 disposed on the second surface 11B of the first substrate 11 and connected to the heat transfer through-holes 22. The first conductive layer 16 is insulated from the first electrode 14 and the second electrode 15. As a result, the thermoelectric power generation module 10 can receive heat from the housing 100 via the first conductive layer 16 and the heat transfer through-holes 22 while suppressing a decrease in heat transfer efficiency due to thermal resistance of a base material of the printed substrate 20.

In the embodiment, the heat transfer through-holes 22 are connected to the heat transfer pad 21A disposed on the first surface 20A of the printed substrate 20. The heat transfer pad 21A is fixed to the first conductive layer 16 of the thermoelectric power generation module 10 by the solder 30. As a result, the thermoelectric power generation module 10 can receive heat from the housing 100 via the first conductive layer 16 and the heat transfer through-holes 22 while suppressing a decrease in heat transfer efficiency due to thermal resistance of a base material of the printed substrate 20.

In the embodiment, the thermoelectric power generation module 10 includes the electrode through-hole 18 penetrating the first substrate 11, and the second conductive layer 17 disposed on the second surface 11B of the first substrate 11 and electrically connected to an electronic circuit of the printed substrate 20. The electrode through-hole 18 electrically connects the first electrode 14A disposed on the first surface 11A of the first substrate 11 to the second conductive layer 17. This eliminates need for wiring for supplying power generated by the thermoelectric power generation module 10 to an electronic circuit of the printed substrate 20. Therefore, the number of manufacturing steps can be reduced, and a defect risk due to disconnection of a lead or a wire can be avoided.

In the embodiment, the printed substrate 20 includes the electrode pad 21B disposed on the first surface 20A. The electrode pad 21B is fixed to the second conductive layer 17 of the thermoelectric power generation module 10 by the solder 30. This eliminates need for wiring such as a lead or a wire for electrically connecting the printed substrate 20 to the thermoelectric power generation module 10. Therefore, the number of manufacturing steps can be reduced, and a defect risk due to disconnection of a lead or a wire can be avoided.

OTHER EMBODIMENT

Note that in the above embodiment, power generated by the thermoelectric power generation module 10 is output to an electronic circuit of the printed substrate 20 via the electrode through-hole 18 formed in the first substrate 11. The thermoelectric power generation module 10 may output power via a lead or a lead disposed so as to connect the first electrode 14A of the first substrate 11 to the electrode pad 21B of the printed substrate 20.

According to the present disclosure, heat transfer can be promoted.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A thermoelectric power generation module mounting substrate comprising:
a printed substrate having a first surface and a second surface that is opposite to the first surface and configured to be in contact with a housing, the printed substrate defining a heat transfer through-hole that passes through the first surface and the second surface;
a thermoelectric power generation module that is mounted on the printed substrate and faces the first surface of the printed substrate; and
a heat transfer pad disposed on the first surface of the printed substrate and spaced apart from the thermoelectric power generation module, the heat transfer pad covering an end of the heat transfer through-hole.

2. The thermoelectric power generation module mounting substrate according to claim 1, wherein the thermoelectric power generation module includes:
a first substrate;
a second substrate facing the first substrate with a gap interposed therebetween;
a plurality of first electrodes disposed on a surface of the first substrate facing the second substrate, the plurality of first electrodes including a first electrode;
a plurality of second electrodes disposed on a surface of the second substrate facing the first substrate, the plurality of second electrodes including a second electrode;
thermoelectric conversion elements disposed between the first electrode and the second electrode and connected to each other directly via the first electrode or the second electrode; and
a first conductive layer disposed on a surface of the first substrate opposite to the surface where the first electrode is disposed, electrically insulated from the first electrode and the second electrode, and connected to the heat transfer through-hole.

3. The thermoelectric power generation module mounting substrate according to claim 2, wherein:
the heat transfer through-hole is connected to the heat transfer pad, and
the heat transfer pad is fixed to the first conductive layer by solder.

4. The thermoelectric power generation module mounting substrate according to claim 2, wherein the thermoelectric power generation module includes:
an electrode through-hole that penetrates the first substrate, the electrode through-hole having one end that is connected to the first electrode, the first electrode being connected to a thermoelectric conversion element disposed at an end of the thermoelectric conversion elements; and
a second conductive layer that is disposed on the surface of the first substrate opposite to the surface where the first electrode is disposed, the second conductive layer being connected to the another end of the electrode through-hole, and being electrically connected to an electronic circuit of the printed substrate.

5. The thermoelectric power generation module mounting substrate according to claim 4, wherein:
the electrode through-hole is connected to an electrode pad disposed on the first surface, and
the electrode pad is fixed to the second conductive layer by solder.

6. The thermoelectric power generation module mounting substrate according to claim 1, further comprising a first conductive layer that is disposed between the heat transfer pad and the thermoelectric power generation module and in contact with the thermoelectric power generation module, and
wherein the heat transfer pad is fixed to the first conductive layer by solder.

7. The thermoelectric power generation module mounting substrate according to claim 1, wherein another end of the heat transfer through-hole is in contact with the housing.

8. The thermoelectric power generation module mounting substrate according to claim 1, wherein the heat transfer pad is in direct contact with the first surface of the printed substrate.

9. The thermoelectric power generation module mounting substrate according to claim 1, wherein the heat transfer pad is recessed from the first surface of the printed substrate.

10. The thermoelectric power generation module mounting substrate according to claim 4, further comprising an electrode pad that is disposed on the first surface of the printed substrate and in direct contact with the second conductive layer.

11. The thermoelectric power generation module mounting substrate according to claim 10, wherein the electrode pad and the heat transfer pad are spaced apart from each other along the first surface of the printed substrate.

12. The thermoelectric power generation module mounting substrate according to claim 10, wherein the heat transfer through-hole is not defined under the electrode pad.

13. The thermoelectric power generation module mounting substrate according to claim 4, wherein the first electrode is in direct contact with the thermoelectric conversion element disposed at the end of the thermoelectric conversion elements, and wherein the second conductive layer is in direct contact with the another end of the electrode through-hole.

\* \* \* \* \*